United States Patent [19]

Shannon

[11] Patent Number: 4,862,238
[45] Date of Patent: Aug. 29, 1989

[54] TRANSISTORS

[75] Inventor: John M. Shannon, Whyteleafe, England

[73] Assignee: U.S. Philips Corporation, New York, N.Y.

[21] Appl. No.: 487,234

[22] Filed: Apr. 22, 1983

Related U.S. Application Data

[63] Continuation of Ser. No. 176,221, Aug. 7, 1980, abandoned.

[30] Foreign Application Priority Data

Aug. 8, 1979 [GB] United Kingdom ................ 7927647
Dec. 20, 1979 [GB] United Kingdom ................ 7943911

[51] Int. Cl.[4] ........................................... H01L 29/72
[52] U.S. Cl. ......................................... 357/34; 357/4; 357/13; 357/15; 357/16
[58] Field of Search ..................... 357/13, 34, 4, 15, 16

[56] References Cited

U.S. PATENT DOCUMENTS

| | | | |
|---|---|---|---|
| 3,121,809 | 2/1964 | Atalla | 357/15 |
| 3,940,783 | 2/1976 | Polata | 357/13 |
| 4,127,861 | 11/1978 | Deneuville | 357/4 |
| 4,149,174 | 4/1979 | Shannon | 357/15 |

Primary Examiner—William D. Larkins
Attorney, Agent, or Firm—Paul R. Miller

[57] ABSTRACT

A hot-electron or hot-hole transistor includes a base region through which current flow is by hot majority charge carriers. The emitter-base barrier-forming means comprises a barrier region having a sufficiently large thickness and impurity concentration of the opposite conductivity type that the barrier region is at least over part of its thickness undepleted by the depletion layer or layers present at the emitter-base barrier at zero bias. The application of a bias voltage ($V_{BE}$) between the base and emitter of the transistor is necessary to establish a supply of the hot majority carriers having energies above the base-collector barrier, and this improves the collection efficiency of the transistor. In one form the emitter-base barrier-forming means also comprises a Schottky contact. In another form the emitter comprises an ohmic contact. The supply of hot majority carriers may be established by avalanche or zener breakdown of the barrier region or by punch-through of the depletion layer(s). A low emitter capacitance can be obtained by including between the emitter contact and the barrier region a lower-doped zone of either conductivity type so as to spread further the depletion layer(s) at the emitter-base barrier. The base-collector barrier can be formed by a fully depleted barrier region. The transistor structure can be formed using ion-implantation or/and molecular beam epitaxy.

6 Claims, 4 Drawing Sheets

TRANSISTORS

This application is a continuation of previous U.S. application Ser. No. 176,221, filed Aug. 7, 1980, now abandoned, and the benefits thereof are hereby claimed for this new application.

This invention relates to transistors, particularly but not exclusively transistors for high frequency applications or fast switching applications. Such transistors may be in the form of discrete devices, or they may be integrated in more complex structures, for example in a monolithic integrated circuit.

U.S. Pat. No. 4,149,174 discloses a transistor comprising a semiconductor body including a base region of one conductivity type through which current flow is by hot majority charge carries, and barrier-forming means which form with the base region emitter-base and base-collector barriers. Such a transistor may be termed a "hot-electron" or "hot-hole" transistor, depending on whether the hot majority charge carriers are electrons or holes.

A hot charge carrier is one which is not in thermal equilibrium with the lattice. Thus hot electrons have energies more than a few k.T above the conduction band edge (where k and T are Boltzmann's constant and the lattice temperature respectively), whereas hot holes have energies more than a few k.T below the valence band edge.

Such transistors can have negligible minority storage effects in both the emitter and base regions and therefore be suitable for use at a fast speed or high frequency. They may also have a low base resistance by choosing a high impurity concentration of the one conductivity type for the base region, and may be relatively insensitive to inhomogeneities in base doping. Therefore such transistors can have significant advantages compared with conventional n-p-n or p-n-p bipolar transistors.

In one form described in the above-mentioned U.S. patent the emitter-base barrier-forming means comprises a barrier region having an impurity concentration of the opposite conductivity type to the base region. This barrier region separates, and forms depletion layers with, both the base region and an emitter region of the same conductivity type as the base region. The barrier region is sufficiently thin that these depletion layers formed at zero bias merge together in the barrier region to substantially deplete at zero bias the whole of the barrier region of mobile charge carriers of both the one and opposite conductivity types.

In the transistors disclosed in the above-mentioned U.S. patent, the emitter-base barrier is chosen to be higher than the base-collector barrier so that most of the hot carriers emitted into the base region have energies sufficiently high to surmount the base-collector barrier, thereby obtaining good collection efficiency. A high collection efficiency is desirable, particularly for obtaining a high common-emitter current gain for the transistor. It is also often desirable to have a low emitter capacitance, particularly for fast switching or high frequency performance.

The present invention provides an improvement in the emitter-base barrier-forming means which raises the energy of the emitted carriers relative to the base-collector barrier and permits the obtaining of structures which can have a low emitter capacitance.

According to the present invention a transistor comprising a semiconductor body including a base region of one conductivity type through which current flow is by hot majority charge carriers, and barrier-forming means which form with the base region emitter-base and base-collector barriers with the emitter-base barrier-forming means comprising a barrier region having an impurity concentration of the opposite conductivity type, is characterized in that the thickness and impurity concentration of the barrier region are sufficiently large that the barrier region is at least over part of its thickness undepleted by the depletion layer or layers present at the emitter-base barrier at zero bias with the application of a bias voltage between the base and emitter of the transistor being necessary to establish a supply of the hot majority carriers having energies above the base-collector barrier.

A bias voltage of a certain magnitude is necessary to establish the supply of hot majority carriers for the base region. This supply can be established by the bias voltage causing the depletion layer(s) to spread across the whole thickness of the barrier region between the emitter and base region; this is a so-called "punch-through" arrangement. Other ways of establishing the supply are also possible, for example by the bias voltage causing either avalanche breakdown of the barrier region or tunnelling of the carriers in the barrier region between the conduction and valence bands. Until the supply is established the undepleted part of the barrier region inhibits emission of hot carriers into the base region and the effect of the applied bias voltage is to increase relative to the base-collector barrier the energy of the carrier distribution to be emitted. In this way when emission occurs the energy of the emitted carriers can be considerably higher than the base-collector barrier, thereby providing a high collection efficiency. As will be described hereinafter a low emitter capacitance can be obtained by using the applied bias voltage to spread the depletion layer or layers present at the emitter-base barrier at zero bias, especially when a lower-doped zone is also incorporated in the emitter structure and when a punch-through arrangement is used.

The barrier region may be present between the base region and either an ohmic contact of the emitter or a Schottky contact of the emitter. The barrier region may be separated from the ohmic or Schottky contact by a lower-doped zone of either conductivity type; when this lower-doped zone is of the one conductivity type it also forms a depletion layer with the barrier region. Due to the spread of the depletion layers in the low-doped zone and in the barrier region, such structures can have a very low emitter capacitance.

Thus in one form, the emitter-base barrier-forming means may comprise a Schottky contact at a surface of the body with the barrier region being present between the Schottky contact and the base region, and at least part of the thickness of the barrier region lying outside the depletion layer present at the Schottky contact at zero bias. The combination of the at least partly undepleted barrier region and the Schottky contact can produce a high emitter-base barrier for injecting very hot majority carriers into the base region thereby improving the collection efficiency. Compared to a Schottky emitter without such a barrier region, the emitter capacitance can also be smaller, particularly if further zones are included to further spread the depletion layer. Thus, the barrier region of the opposite conductivity type may be separated from the Schottky contact by a lower-doped zone which may be either of the opposite conductivity type or of the one conductivity type.

It is generally preferable for the base region to be highly doped to reduce the spread of depletion layers in the base region and reduce the base resistance. Therefore preferably the base region has a conductivity type determining impurity concentration of at least $10^{20}$ dopant atoms/cm$^3$, and may be considered a degenerately-doped semiconductor region. Furthermore in order to avoid an excessive thickness for the emitter barrier region which would make it difficult to incorporate in the transistor structure, the conductivity type determining impurity concentration of the barrier region should generally be greater than $10^{18}$ dopant atoms/cm$^3$.

These and other features in accordance with the invention and some of their advantages will now be described with reference to the accompanying diagrammatic drawings illustrating, by way of example, various embodiments of the invention. In these drawings.

Figure 1:
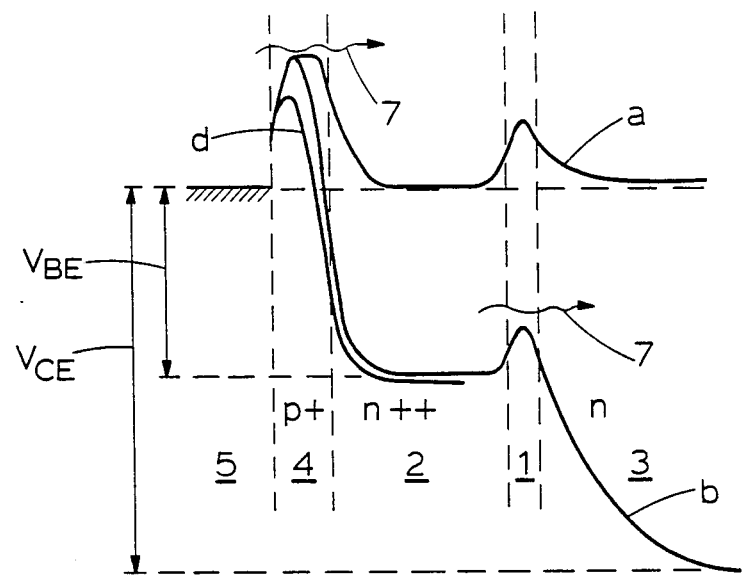
FIGS. 1 and 2 are energy diagrams through similar transistors in accordance with the invention, both under bias and zero bias conditions.

It should be noted that all of the Figures are diagrammatic and not drawn scale; and the relative dimensions and proportions of some parts of these Figures have been shown exaggerated or reduced for the sake of clarity and convenience. The same reference numerals as used in one Figure are generally used to refer to the same or similar parts in the other Figures.

The transistor illustrated in FIG. 1 comprises a monocrystalline semiconductor body including semiconductor regions 1 to 4. The region 2 is a highly doped base region of one conductivity type (in this example, n-type). Barrier-forming means 1 and 4,5 form with the base region 2 a base-collector barrier and an emitter-base barrier respectively. The current flow through the base region 2 (from the emitter-base barrier to the base-collector barrier) is by hot majority carriers (in this example, hot electrons for n-type base region 2) which are indicated by arrows 7.

The base-collector barrier is formed by a barrier region 1 having an impurity concentration characteristic of the opposite conductivity type (in this example, p-type) the magnitude of which determines the height of a potential barrier to the flow of charge carriers of the one type (in this example, electrons) from both the base region 2 and a collector region 3. The barrier region 1 is sufficiently thin that depletion layers which it forms at zero bias with both the base and collector regions merge together in the region 1 to substantially deplete even at zero bias the whole of the region 1 of mobile charge carriers of both conductivity types. The collector region 3 is of the same conductivity type (n-type) as the base region 2 but is less highly doped. Preferably the conductivity type determining impurity concentration of the base region is at least $10^{20}$ donor atoms/cm$^3$.

The formation and use of such substantially depleted barrier regions 1 for the base-collector barriers of hot-electron (or hot hole) transistors are described in detail in U.S. Pat. No. 4,149,174, to which reference is invited and the whole contents of which are hereby incorporated as background material into the present application. In order to maintain the barrier region 1 substantially depleted at zero bias the thickness and doping level of the region 1 must satisfy certain conditions as described in U.S. Pat. No. 4,149,174.

The emitter-base barrier is formed by both a metal layer 5 forming a Schottky contact and a barrier region 4 having an impurity concentration of opposite conductivity type (p-type) to the base region 2. It should be noted that U.S. Pat. No. 4,149,174 describes transistors having an emitter-base barrier formed either by a Schottky contact or by a substantially depleted barrier region. However in accordance with the present invention the barrier region 4 is present between the Schottky contact 5 and the base region 2 and has a sufficiently large thickness and impurity concentration that at least part of its thickness lies outside the depletion layer present at said Schottky contact 5 at zero bias. Therefore with no bias voltage applied between the Schottky emitter 5 and the base region 2 the barrier region 4 is undepleted over at least part of its thickness and so behaves as a p-type layer, designated p+ in FIG. 1.

Line a in FIG. 1 is the electron energy and potential diagram through the transistor structure in this thermal equilibrium, zero bias condition.

Line b in FIG. 1 is the corresponding diagram with the base region 2 and collector region 3 biased relative to the emitter 5 by voltages $V_{BE}$ and $V_{CE}$ respectively. The application of a bias voltage $V_{BE}$ is necessary to establish a supply of hot electrons 7 having energies above the base-collector barrier. In this FIG. 1 example, hot electrons 7 are not injected into the base region 2 from the emitter 5 in any significant quantity until the base-emitter bias voltage $V_{BE}$ is of sufficient magnitude to spread the depletion layer across the whole thickness of the barrier region 4. The depletion layer is then said to "punch-through" the region 4, between the emitter 5 and the base region 2, thereby resulting in current flow by thermionic emission of electrons 7. The line b in FIG. 1 illustrates the situation when $V_{BE}$ is of just sufficient magnitude to deplete the whole of region 4. As can be seen by comparing lines a and b in FIG. 1 this need to apply a bias voltage $V_{BE}$ of at least a given magnitude before current flow occurs results in the potential of the base-collector barrier region 1 being shifted to a lower level (more positive) with respect to the emitter 5, so that when carrier injection does occur (line b) the energy of the emitted carriers 7 has been raised to a significant extent relative to the base-collector barrier 1. Thus, the incorporation of an emitter-base barrier region 4 having an undepleted thickness at zero bias increases the collection efficiency of the base-collector barrier 3. Collection efficiencies as high as 75% and more are possible in this way.

The magnitude of the bias voltage $V_{BE}$ needed to wholly deplete the region 4 depends on the thickness and impurity concentration of region 4 provided between the Schottky contact 5 and the base region 2. In a typical case these may be chosen such that a bias voltage $V_{BE}$ of at least 0.5 volt is necessary for "punch-through" to occur, thereby raising the energy of the emitted carriers by a corresponding amount. Operating the transistor with an emitter-base bias voltage above the minimum level needed for punch-through reduces the height of the emitter-base barrier and so increases the current flow into the base region 2. This situation is illustrated in FIG. 1 by the partial line d.

Figure 2:
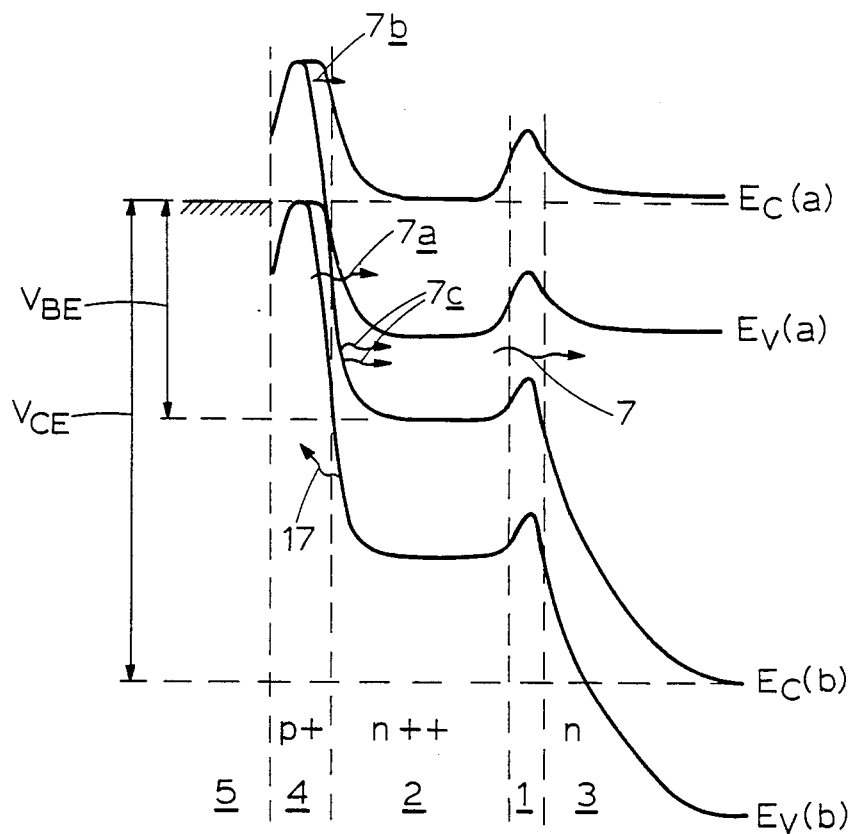

However such a barrier region 4 which is not depleted over its whole thickness at zero bias may have such a high impurity concentration that the applied bias voltage $V_{BE}$ causes either avalanche or zener breakdown of the barrier region before a punch-through condition can be reached. Such a situation is illustrated in FIG. 2. In FIG. 2, $E_c(a)$ and $E_v(a)$ illustrate the respective edges of the conduction band and valence band in the zero bias condition, whereas $E_c(b)$ and $E_v(b)$ illustrate these edges with a bias voltage $V_{BE}$ applied between the emitter 5 and base region 2. As a result of the higher impurity concentration of the barrier region 4 in this modified arrangement, the applied bias voltage $V_{BE}$ forms in the depletion layers in the region 4 an electric field which is high enough to break down the barrier region 4 either by an avalanche or zener mechanism, thereby establishing a supply of hot electrons 7 which are injected into the base region 2 with energies considerably above the base-collector barrier 1. As illustrated in FIG. 2 the applied bias $V_{BE}$ bends the energy bands by more than the band-gap ($E_c - E_v$). In the case of zener breakdown the resulting field is high enough to remove electrons from the silicon lattice atoms so that direct tunnelling of electrons occurs from the valence band to the conduction band as illustrated by arrow 7a in FIG. 2. In the case of avalanche breakdown the resulting field is high enough to accelerate carriers 7b to such an extent between collisions with the silicon lattice atoms that on collision they are capable of electron-hole pair generation with the hot electrons 7c being injected into the base region 2 while the hot holes flow to the emitter 5 as illustrated by arrow 17 in FIG. 2. The bias voltage used for such a modified emitter using avalanche or zener breakdown may for example exceed 1.5 volts.

Figure 3:
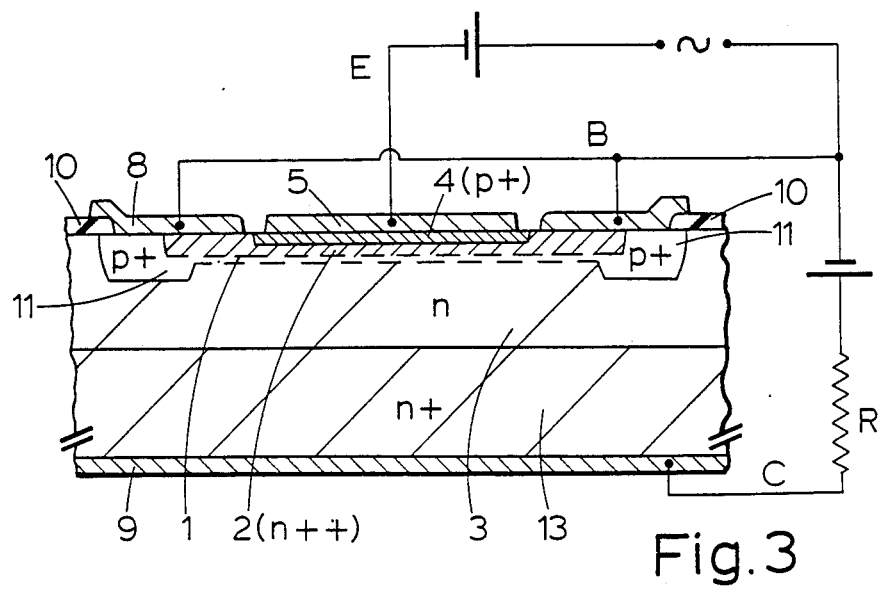
FIG. 3 is a cross-sectional view of one example of such a transistor and showing possible circuit connections.

FIG. 3 illustrates one example of a transistor such as that of FIG. 1 or FIG. 2. Apart from the inclusion of the barrier region 4 this transistor structure is similar to transistors described in U.S. Pat. No. 4,149,174 and can be made in a similar manner using ion implantation. The collector region 3 is provided by an n-type silicon epitaxial layer on a highly doped silicon substrate 13 of the same conductivity type. An undepleted p-type annular zone 11 which is to act as a guard-ring around the edge of the barrier region 1 is formed in the epitaxial layer 3, for example by dopant diffusion as described in U.S. Pat. No. 4,149,174. Then, via a window in an insulating layer 10 of, for example, silicon dioxide at the epitaxial layer surface, the regions 1, 2 and 4 are formed in the epitaxial layer 3 by ion implantation.

The barrier region 4 may implanted first using a smaller window in the layer 10, after which the window may be widened for implantation of the base region 2 followed by the barrier region 1. The implanted ion dose and energy for the region 4 must together be sufficiently high to ensure that the region 4 not only overdopes the background n-type impurity resulting from the n-type regions 2 and 3 but also lies at least partly beyond the depletion layer which will be present at the Schottky contact 5 at zero bias so that at zero bias at least part of the region 4 forms an undepleted p-type zone. The ion energy chosen for forming the base region 2 may be such that the resulting impurity concentration has a maximum value spaced from the barrier region 4. When the bias voltages are applied to the emitter 5 and base and collector contacts 8 and 9 this spacing introduces a potential drop between the emitter 5 and the undepleted portion of the base region 2 so that the potential of the collector barrier region 1 is shifted even further to lower levels with respect to the emitter 5 as the bias is increased. This feature further aids the collection efficiency and is described in U.S. Pat. No. 4,149,174.

In a typical example, 1 KeV boron ions or 4 KeV indium ions in a dose of for example at least $10^{14}$ per $cm^2$ may be implanted to form the undepleted barrier region 4, 10 KeV arsenic ions in a dose of $10^{14}$ to $10^{15}$ per $cm^2$ may be implanted to form the base region 2, and 5 KeV boron ions or 20 KeV indium ions may be implanted in a dose of $5 \times 10^{12}$ to $5 \times 10^{13}$ per $cm^2$ to form the wholly depleted barrier region 1. The epitaxial layer 3 may have a resistivity of, for example, 5 or 10 ohm-cm and a thickness of, for example, 12 microns. With such implantation conditions and depending on the annealing conditions, the peak of the implanted arsenic distribution can be estimated as occurring at about 150Å (0.015 micron) or more below the surface of the epitaxial layer with a concentration of about $10^{20}$ to $10^{21}$ arsenic atoms per $cm^3$. The p-type barrier region 4 is formed within about 100Å (0.010 micron) of the surface, and has such a high impurity concentration that it is estimated to be undepleted at zero bias over considerably more than half its thickness. The distance between the barrier regions 4 and 1 can be estimated as being about 250Å (0.025 micron) or more. The width of the barrier region 1 may be estimated as being about 150Å (0.015 micron).

After annealing the implants metal layers 5, 8 and 9 are provided in known manner. The layers 8 and 9 (which may be of for example aluminium) form ohmic contacts to the base region 2 and the collector substrate 13 respectively. The layer 5 forms the Schottky contact for the transistor emitter and may be of for example gold or nickel.

The annealing conditions determine how much of each implanted impurity dose becomes electrically active and whether any significant diffusion of the implant occurs. When the boron or indium ion dose implanted to form the barrier region 4 is about $10^{14}$ ions per $cm^2$ and is subsequently annealed at about 750° C. in a vacuum for 15 minutes, calculations indicate that the resulting average active impurity concentration of the region 4 is between $5 \times 10^{19}$ and $10^{20}$ atoms per $cm^3$ and that the applied bias voltage $V_{BE}$ causes punch-through of the depletion layers in the resulting barrier region 4. The average active impurity concentration of the barrier region 4 can be increased slightly by using a higher annealing temperature and to a larger extent by using a higher dose. In this way the active concentration of region 4 can be increased to such an extent that breakdown and the resulting supply of hot electrons can be established by an avalanche or zener mechanism in the depletion layers, rather than by punch-through. In order to reduce diffusion of the implant a prolonged annealing temperature should in general not exceed 850° C. However the annealing can be effected by localized heating to higher temperatures using a short-pulsed laser or electron beam.

During operation in the circuit configuration illustrated in FIG. 3, the emitter 5 is biased negatively with respect to the base contact 8 which is itself biased negatively with respect to the collector contact 9. As discussed hereinbefore significant current flow between the emitter 5 and collector contact 9 does not occur unless the voltage applied between the emitter 5 and base contact 8 is sufficient to deplete the barrier region 4 over its whole thickness or cause avalanche or zener breakdown. As indicated in FIG. 3, an input signal (for example of high frequency) can be applied between the emitter 5 and base contact 8, and an amplified output signal can be derived across a load R between the base and collector contacts 8 and 9. Because of its high collector efficiency the transistor can have a high current gain.

Figure 4:
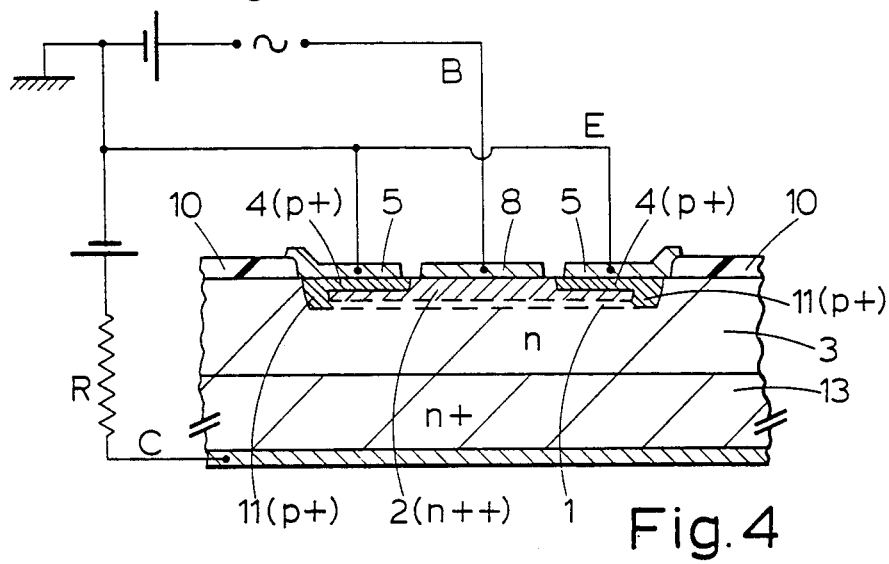
FIG. 4 is a cross-sectional view of another example of such a transistor and showing possible circuit connections.

It will be evident that many modifications of this transistor structure are possible in accordance with the invention. Thus, for example as illustrated in FIG. 4 the Schottky emitter 5 and its barrier region 4 may be of annular form and extend around the base contact 8. In this form having an outer emitter, the shallow p-type barrier region 4 may merge into the deeper p-type guard ring 11 of the depleted barrier region 1. As illustrated in FIG. 4, the p-type guard ring 11 need not be formed in a separate doping step but may be formed in the implantations for the barrier regions 1 and 4, by effecting these implantations after the implantation for the base region 2 and through a slightly widened window in the layer 10; a similar process is described in U.S. Pat. No. 4,149,174.

Other features described in U.S. Pat. No. 4,149,174 may also be incorporated. Thus, for example, the doping concentration of the layer 3 immediately adjacent the barrier region 1 may be increased by a further donor implant. Such a local increase in doping may be contained within approximately 150Å (0.015 micron) of the barrier region 1 and serves to increase the magnitude of the electric field therein so steepening the fall-off of potential in the region 3 and further aiding the collection efficiency.

Figure 5:
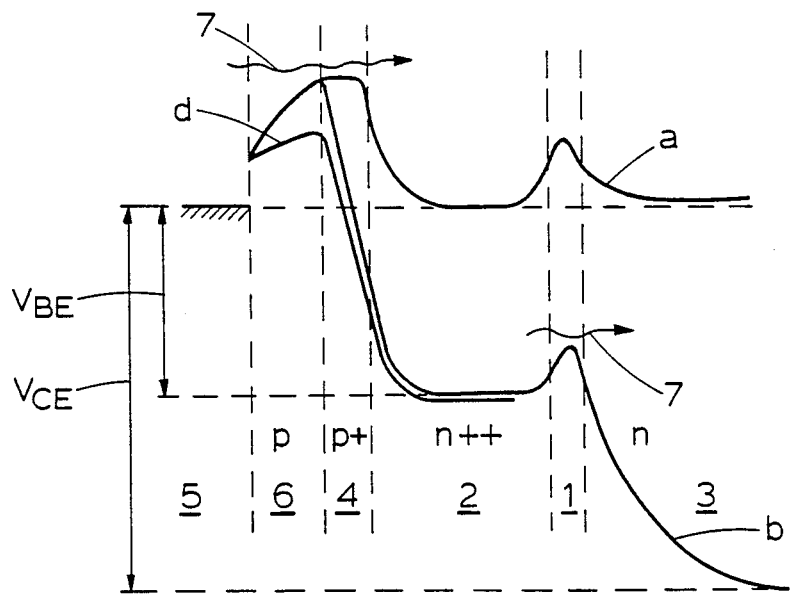
FIG. 5 is an energy diagram through a modified form of the transistor of FIG. 1, both under bias and zero bias conditions.

FIG. 5 illustrates a further modification in accordance with the invention, in which a lower doped zone 6 is incorporated in the emitter structure, between the Schottky contact 5 and the main barrier region 4. For punch-through operation this zone 6 must also be fully depleted under emitter-base bias for emission of hot electrons to occur into the base region 2 from the Schottky contact 5. A similarly low-doped zone 6 may be included with an avalanche or zener breakdown barrier region 4. The addition of zone 6 causes the depletion layer associated with the emitter-base barrier to be even wider compared with the FIG. 1 structure, so that in operation the emitter capacitance of the transistor is reduced. In the form shown in FIG. 5, the zone 6 is of the same conductivity type as the barrier region 4 (p-type), although it may alternatively be of the same conductivity type as the base region 2 (n-type). The doping concentration of the zone 6 may be, for example, about $10^{17}$ atoms per $cm^3$.

The FIG. 5 structure may be manufactured by using slightly higher ion energies for implantation of the regions 4, 2 and 1 so that the peak concentration of the implanted impurity forming the region 4 is spaced from the surface of the epitaxial layer. The zone 6 may be formed by the impurity present between this peak concentration and the surface, although preferably its impurity concentration is provided in a separate step, for example by a separate lower-dose implantation.

In a modification of the FIG. 5 transistor structure, the Schottky contact 5 is replaced by a highly-doped n-type emitter region. In this case the emitter-base barrier is formed solely by the p-type barrier regions 4 and 6 which form p-n junctions with the base region 2 and with this emitter region. It is similarly possible to modify the FIG. 1 and FIG. 2 transistor structures by replacing the Schottky contact 5 with a highly-doped n-type emitter region.

Figure 6:
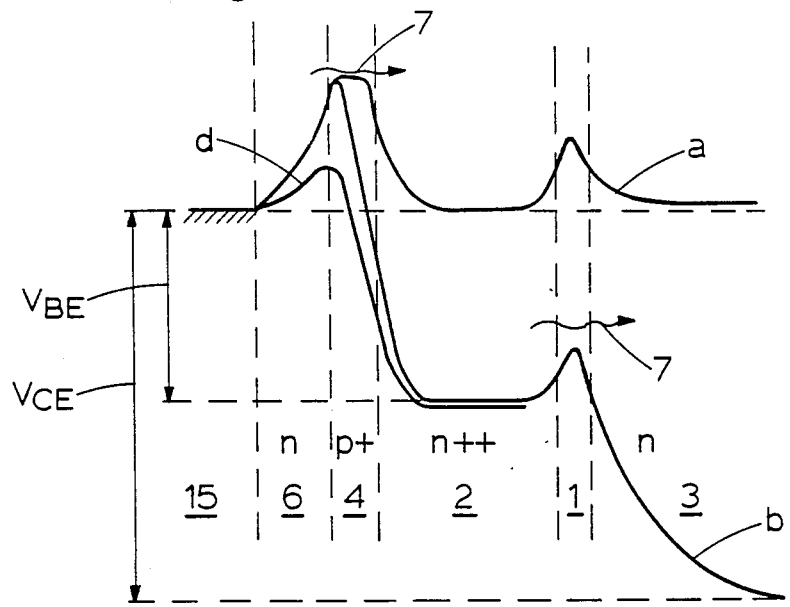
FIG. 6 is an energy diagram through a further transistor in accordance with the invention, both under bias and zero bias conditions.

FIG. 6 illustrates a hot-electron transistor structure in accordance with the invention, in which the emitter-base barrier is formed solely by the p-type barrier region 4 which forms p-n junctions with both the n-type base region 2 and a low-doped n-type emitter zone 6. A layer 15 forms an ohmic contact to the emitter zone 6, and this layer 15 may be for example of metal such as aluminium or of highly-doped n-type semiconductor material. In a manner similar to that for the Schottky-emitter transistors of FIGS. 1 to 5, the application of a bias voltage $V_{BE}$ between base region 2 and emitter contact 15 is necessary to spread the depletion layers of both these p-n junctions across the whole thickness of the region 4 or to cause avalanche or zener breakdown of the barrier region 4. As with the transistors of FIGS. 1 to 5, this raises the energy of the emitted carriers 7 relative to the base-collector barrier. However, compared with the transistors of FIGS. 1 to 5 the ideality factor of the emitter-base barrier can be better (i.e. closer to unity), and the emitter capacitance can be smaller.

A transistor having a structure like that shown in FIG. 6 can be manufactured in a similar manner to those of FIGS. 1 to 5, using ion implantation. One way of providing the zone 6 and contact layer 15 is as follows: after forming the regions 1, 2 and 4 in a silicon epitaxial layer by ion implantation, a high resistivity silicon layer and then a highly-doped n-type silicon layer can be deposited on part of the p-type barrier region 4 at a window in an insulating layer to provide the zone 6 and layer 15 respectively. The high resistivity layer may be of, for example, amorphous silicon which is subsequently crystallized with a laser or an electron beam used to anneal the implants. The highly-doped n-type silicon layer may also be deposited in contact with part of the base region 2 to provide the base contact.

Figure 7:
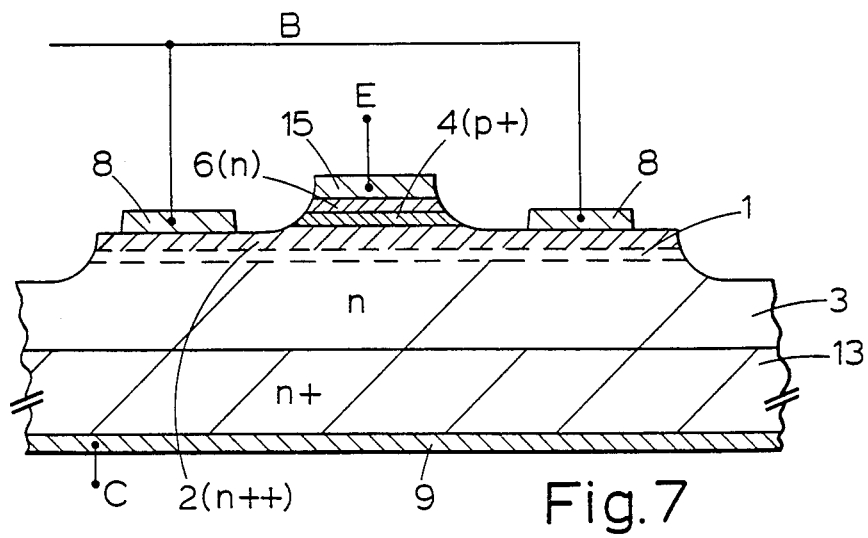
FIG. 7 is a cross-sectional view of one example of the transistor of FIG. 6.

FIG. 7 illustrates another form of the transistor structure of FIG. 6 which can be manufactured using molecular-beam epitaxy. The transistor comprises a highly-doped n-type substrate 13 of for example gallium arsenide on which a less-highly doped n-type epitaxial layer of the same material is grown in a conventional manner, for example by liquid phase epitaxy. Layers of gallium arsenide having the thickness and impurity concentrations desired for the regions 1, 2, 4 and 6 are then deposited in succession on the surface of the layer 3 using molecular beam epitaxy. The two upper layers are then removed by an ion beam milling or other etching process over the whole of their thickness, expect where they are masked to form the zone 6 and barrier region 4. Then, the other two layers are similarly removed over the whole of their thickness, except where they are masked to form the base region 2 and barrier region 1. Metal layers forming ohmic contacts with the semiconductor are deposited to provide the emitter, base and collector contacts 15, 8 and 9. If desired the contact 15 may be provided before the layer removal and used as a mask while defining the lateral extent of the zone 6 and region 4 by ion-beam milling. Instead of a layer removal treatment for defining the lateral extent of the regions 1 and 2, localised proton bombardment may be effected to form semi-insulating zones around the regions 1 and 2.

The transistors so far described have been hot-electron transistors having n-type base regions 2. However, hot-hole transistors are also possible in accordance with the invention, in which case the base and collector regions 2 and 3 would be p-type and the barrier regions 1 and 4 would be doped with donor impurity.

The transistors as shown in FIGS. 3, 4 and 7 have one emitter-base barrier. However, transistors in accordance with the present invention may have a plurality of emitters which form a plurality of emitter-base barriers with a base region 2. Such multiple-emitter transistors may, for example, be used for higher power operation or as a fast switching transistor in a logic circuit.

Hot-electron or hot-hole transistor structures in accordance with the present invention can be integrated with other semiconductor regions and provided with contacts to form more complex devices, for example a thyristor or an integrated circuit. In the devices illustrated in FIGS. 3, 4 and 7, the collector region 3 is part of an epitaxial layer which is present on a substrate 13 of the same conductivity type, and an electrode connection 9 to the region 3 contacts the back of the substrate 13. However devices and integrated circuits comprising transistors in accordance with the invention are also possible in which the collector region 3 is part of a layer of one conductivity type which is present on a substrate of the opposite conductivity type, for example for isolation purposes, and in which an electrode connection to the collector region 3 contacts the surface of the epitaxial layer, for example with a more highly doped surface-zone and buried-layer in the epitaxial layer to reduce the series resistance.

In the transistors shown in FIGS. 3, 4 and 7, the base-collector barrier is buried in the semiconductor body below the emitter-base barrier which is adjacent a surface of the body. However, transistors in accordance with the present invention are also possible having their emitter-base barrier buried in the semiconductor body below one or more collector-base barriers. Thus, for example the collector-base barrier(s) may comprise a Schottky contact to the base region 2, and the emitter-base barrier may consist of a barrier region 4 which is not depleted across part of its thickness at zero bias, the emitter region being a semiconductor region of the same conductivity type as the base region 2.

In the transistors so far described, the base-collector barrier is formed by a barrier region 1 which is substantially depleted across the whole of its thickness at zero bias. However, for some applications, it may be preferable to have a base-collector barrier region 1 which is not depleted across part of its thickness at zero bias. In this situation the magnitude of the reverse current can be less than in the situation where the region 1 is fully depleted.

I claim:

1. An improved transistor comprising a semiconductor body including a base region of one conductivity type having current flow by hot majority charge carriers, a base-collector barrier, and an emitter-base barrier region having an impurity concentration of an opposite conductivity type, wherein the improvement comprises said emitter-base barrier region having a thickness and impurity concentration sufficiently large to provide at least a part of the thickness of said emitter-base barrier region undepleted at zero bias by at least one depletion layer present at said emitter-base barrier region, and means for applying a bias voltage between said emitter-region and said base-region to establish by avalanche breakdown of said emitter-base barrier region a supply of said hot majority charge carriers having energies above said base-collector barrier.

2. An improved transistor comprising a semiconductor body including a base region of one conductivity type having current flow by hot majority charge carriers, a base-collector barrier, and an emitter-base barrier region having an impurity concentration of an opposite conductivity type, wherein the improvement comprises said emitter-base barrier region having at least a part of its thickness undepleted at zero bias by at least one depletion layer present at said emitter-base barrier region, and means for applying across said emitter-base barrier region a bias voltage of a magnitude sufficient to establish by tunneling between conduction and valence bands in said emitter-base barrier region a supply of said hot majority carriers into said base region with energies above said base-collector barrier.

3. An improved transistor comprising a semiconductor body including a base region of one conductivity type having current flow by hot majority charge carriers, a base-collector barrier, and an emitter-base barrier region having an impurity concentration of an opposite conductivity type, wherein the improvement comprises at least a part of the thickness of said emitter-base barrier region being undepleted at zero bias by at least one depletion layer present at said emitter-base region, and means for applying a bias voltage across the emitter-base barrier region to establish a supply of hot majority charge carriers into said base region with energies above said base-collector barrier by spreading said at least one depletion layer across the entire thickness of said emitter-base barrier region, said emitter-base barrier region having a sufficiently high impurity concentration that said bias voltage necessary to establish said supply is at least 0.5 volts, and said emitter-base barrier region being sufficiently thin that said majority charge carriers supplied to said base region from across the depleted emitter-base barrier region have gained kinetic energy equivalent to the bias voltage across the depleted emitter-base barrier region, wherein said emitter-base barrier region is present between said base region and an ohmic contact of the emitter, wherein said emitter-base barrier region is separated from said ohmic contact by a lower-doped zone than said barrier region and wherein said lower-doped zone is of said opposite conductivity type.

4. An improved transistor comprising a semiconductor body including a base region of one conductivity type having current flow by hot majority charge carriers, a base-collector barrier, and an emitter-base barrier region having an impurity concentration of an opposite conductivity type, wherein the improvement comprises at least a part of the thickness of said emitter-base barrier region being undepleted at zero bias by at least one depletion layer present at said emitter-base region, and means for applying a bias voltage across the emitter-base barrier region to establish a supply of hot majority charge carriers into said base region with energies above said base-collector barrier by spreading said at least one depletion layer across the entire thickness of said emitter-base barrier region, said emitter-base barrier region having a sufficiently high impurity concentration that said bias voltage necessary to establish said supply is at least 0.5 volts, and said emitter-base barrier region being sufficiently thin that said majority charge carriers supplied to said base region from across the depleted emitter-base barrier region have gained kinetic energy equivalent to the bias voltage across the depleted emitter-base barrier region, wherein a Schottky contact is provided at a surface of said semiconductor body over said emitter-base barrier region, wherein at least a part of said thickness of said emitter-base barrier region lies outside the depletion layer present at said Schottky contact at zero bias, and wherein said emitter-base barrier region is separated from said Schottky contact by a lower-doped zone than said barrier region.

5. An improved transistor according to claim 4, wherein said lower-doped zone is of said one conductivity type, and forms a depletion layer with said emitter-base barrier region.

6. An improved transistor according to claim 4, wherein said lower-doped zone is of said opposite conductivity type.

* * * * *